(12) United States Patent
Sanada et al.

(10) Patent No.: US 7,158,372 B2
(45) Date of Patent: Jan. 2, 2007

(54) ELECTRONIC CONTROL UNIT

(75) Inventors: Satoshi Sanada, Chiryu (JP); Takao Tsunooka, Kariya (JP); Matsuhisa Tsuruta, Toyota (JP)

(73) Assignee: Advics Co., Ltd., Aichi-ken (JP)

( * ) Notice: Subject to any disclaimer, the term of this patent is extended or adjusted under 35 U.S.C. 154(b) by 332 days.

(21) Appl. No.: 10/893,904

(22) Filed: Jul. 20, 2004

(65) Prior Publication Data

US 2005/0018390 A1    Jan. 27, 2005

(30) Foreign Application Priority Data

Jul. 25, 2003    (JP) .............................. 2003-279989

(51) Int. Cl.
G06F 1/16      (2006.01)
B60T 15/18    (2006.01)

(52) U.S. Cl. ...................... 361/679; 361/637; 361/752; 439/246; 439/76.1; 137/557; 137/884; 303/116.4; 303/119.2; 303/119.3; 303/113.1

(58) Field of Classification Search ................ 361/679, 361/637, 752, 719–727, 760–764; 137/557, 137/560, 884, 596.17; 303/113.1, 116.6, 303/119.2, 119.3, 116.1, 115.2, 115.1; 439/246, 439/78, 83, 81, 76.1, 76.2, 733.1, 40, 723
See application file for complete search history.

(56) References Cited

U.S. PATENT DOCUMENTS 5,152,322 A * 10/1992 Maas et al. ................. 137/884
5,275,478 A * 1/1994 Schmitt et al. ........... 303/119.2
6,148,855 A * 11/2000 Rauner et al. .............. 137/560
6,155,856 A   12/2000 Sanada
6,164,732 A * 12/2000 Tominaga et al. ....... 303/119.2
6,354,674 B1* 3/2002 Iwamoto et al. ......... 303/119.3

FOREIGN PATENT DOCUMENTS

JP    02000159083 A  *  6/2000
JP    02000264192 A  *  9/2000

* cited by examiner

*Primary Examiner*—Michael Datskovskiy
(74) *Attorney, Agent, or Firm*—Buchanan Ingersoll & Rooney PC

(57) ABSTRACT

In an electronic control unit, a chassis is provided with a plate portion, and a circuit board is secured to a board-side attaching surface of the plate portion with a predetermined space secured relative to the plate portion. The chassis is further provided with a side wall protruding from the circumferential portion of the other surface of the plate portion and is mounted on a surface of a housing incorporating a device therein, with an end surface of the side wall being seated on the surface of the housing. A bus bar is fixed at a fixing portion thereof to the board-side attaching surface between the plate portion and the circuit board and is connected to a terminal of the device which is taken out from the housing. The bus bar is provided at plural free ends thereof with branch portions at which lead portions extend to be joined at end portions thereof to the circuit board. Elastic portions for reducing stresses which are developed at juncture portions of the lead portions to the circuit board as the temperature changes are formed between the base portion and the branch portions alongside the board-side attaching surface.

7 Claims, 3 Drawing Sheets

ELECTRONIC CONTROL UNIT

This application is based on and claims priority under 35 U.S.C. 119 with respect to Japanese Application No. 2003-279989 filed on Jul. 25, 2003, the entire content of which is incorporated herein by reference.

BACKGROUND OF THE INVENTION

1. Field of the Invention

The present invention relates to an electronic control unit capable of reducing the stress which is developed at juncture portions between a circuit board secured to a chassis of the electronic control unit and lead portions of a bus bar as the temperature changes.

2. Discussion of the Related Art

In a known electronic control unit of this kind as disclosed in U.S. Pat. No. 6,155,856 (equivalent of Japanese unexamined, published patent application No. 2000-164276), a circuit board is fixed with a predetermined distance secured relative to a board-side attaching surface of a plate portion of a chassis or case. A fixing portion of each connector terminal is inserted into an insertion hole from a reverse surface side of the plate portion to be fixed to the insertion hole, and a connection pin of each connector terminal is joined to the circuit board by soldering. In the electronic control unit, a change in temperature causes a stress to be developed at a juncture portion of the connection pin to the circuit board due to the differences in thermal expansion coefficient among the chassis, the circuit board, the connector terminal and the like. In order to reduce the stress, in the known device, a buffering portion or elastic bendable portion is provided between the fixing portion and the connecting pin to absorb the relative displacement which occurs between the circuit board and the plate portion with a change in temperature.

In general, each power line for an electric motor or the like is large in electric current flowing therethrough and therefore, is constituted by a bus bar which is large in width as well as thickness. Where such a bus bar large in width and thickness is joined by soldering to a circuit board without being changed in dimension and shape, the thermal expansion of the bus bar due to a temperature change would cause the soldered juncture portion to be cracked or broken. To obviate this drawback, it has been a practice to divide a base portion of the bus bar connected to a power line for the electric motor, into two lead portions at branch portions on the base portion and to join these lead portions to the circuit board of the electronic control unit. In this case, because of being large in width and thickness, the bus bar cannot be embeded in the plate portion of the chassis. Thus, the bus bar is usually detachably fixed at a fixing portion of its base portion to a board-side attaching surface of the plate portion of the chassis, wherein it has been desired to reduce stresses which are developed at the juncture portions of the two lead portions to the circuit board with a change in temperature.

However, in accordance with the technology described in the foregoing United States patent, it is unable to separate the juncture portions of the two lead portions to the circuit board and to flexibly connect the juncture portions respectively to the fixing portion. The reasons are that the bus bar is detachably fixed to the board-side attaching surface of the plate portion, that the distance between the bus bar and the circuit board is short, and that those parts which extend between the juncture portions of the lead portions to the circuit board and the branch portions at which the lead portions are branched from the base portion act as a single surface which is strong in rigidity.

SUMMARY OF THE INVENTION

Accordingly, it is a primary object of the present invention to provide an improved electronic control unit capable of preventing juncture portions of plural lead portions of a bus bar to a circuit board from being damaged by reducing stresses which are developed at the juncture portions with a change in temperature.

Briefly, in an electronic control unit according to the present invention, a chassis having a plate portion protrudes a side wall from the circumference of the plate portion, and a circuit board is secured to a board-side attaching surface of the plate portion opposite to a surface from which the side wall protrudes. The circuit board extends substantially in parallel to the board-side attaching surface with a predetermined space secured therebetween. A housing incorporating at least one device mounts the chassis on a surface thereof with an end surface of the side wall being in contact with the surface of the housing. A bus bar is further provided, which includes a base portion having a fixing portion at a part thereof fixed to the plate portion and connected to a lead of the at least one device taken out from the housing. The base portion also has plural branch portions thereon. Plural lead portions respectively extend from the plural branch portions of the base portion to be joined at end portions thereof to the circuit board. Plural elastic portions for reducing stresses which are developed respectively at juncture portions of the lead portions to the circuit board as the temperature changes, are provided between the branch portions and the fixing portion of the base portion alongside of the board-side attaching surface.

With this construction, the circuit board for the electronic control unit is secured to the board-side attaching surface of the plate portion of the chassis, with a predetermined space secured relative to the plate portion, and the bus bar is fixed at the fixing portion to the board-side attaching surface so that the branch portions at which plural lead portions branch from the base portion are defined at free ends of the base portion. Since the branch portions of the base portion are defined at the free ends of the same and since the elastic portions are formed between the branch portions and the fixing portion substantially in parallel to the board-side attaching surface, those parts which extend between the juncture portions of the lead portions to the circuit board and the branch portions at which the lead portions are branched from the base portion are flexibly separated from each other. Thus, stresses which are developed at the juncture portions of the lead portions to the circuit board as the temperature changes can be reliably reduced through the elastic portions, whereby the juncture portions can be prevented from being broken or damaged.

In another aspect of the present invention, there is provided an electronic control unit comprising a chassis having a plate portion and protruding a side wall from the circumference of the plate portion, and a circuit board secured to a board-side attaching surface of the plate portion opposite to a surface from which the side wall protrudes. The circuit board extends substantially in parallel to the board-side attaching surface with a predetermined space secured therebetween. A housing incorporating at least one device mounts the chassis on a surface thereof with an end surface of the side wall being in contact with the surface of the housing. A bus bar is further provided including a base portion, plural lead portions, a crank portion and plural flexible portions. The base portion having a fixing portion at a part thereof fixed to the plate portion is connected to a lead of the at least one device taken out from the housing. The base portion has plural branch portions thereon. Plural lead portions extend respectively from the plural branch portions of the base portion and have end portions thereof joined to the circuit board. The crank portion is provided on the base portion to be close to the fixing portion, and the plural flexible portions are provided between the plural branch portions and the fixing portion respectively in correspondence to the lead portions to extend alongside of the board-side attaching surface.

With this construction, the base portion of the bus bar which is fixed at its fixing portion to the base-side attaching surface is provided with the crank portion at a position close to the fixing portion and is further provided with the flexible portions corresponding respectively to the lead portions, between the crank portion and the branch portions substantially in parallel to the board-side attaching surface. Therefore, stresses which are developed at the juncture portions of the lead portions to the circuit board as the temperature changes can be reliably reduced through the crank portion and the flexible portions which are arranged in a narrow space between the board-side attaching surface and the circuit board, whereby the juncture portions can be prevented from being broken or damaged.

BRIEF DESCRIPTION OF THE ACCOMPANYING DRAWINGS

The foregoing and other objects and many of the attendant advantages of the present invention may readily be appreciated as the same becomes better understood by reference to the preferred embodiments of the present invention when considered in connection with the accompanying drawings, wherein like reference numerals designate the same or corresponding parts throughout several views, and in which.

Figure 1:
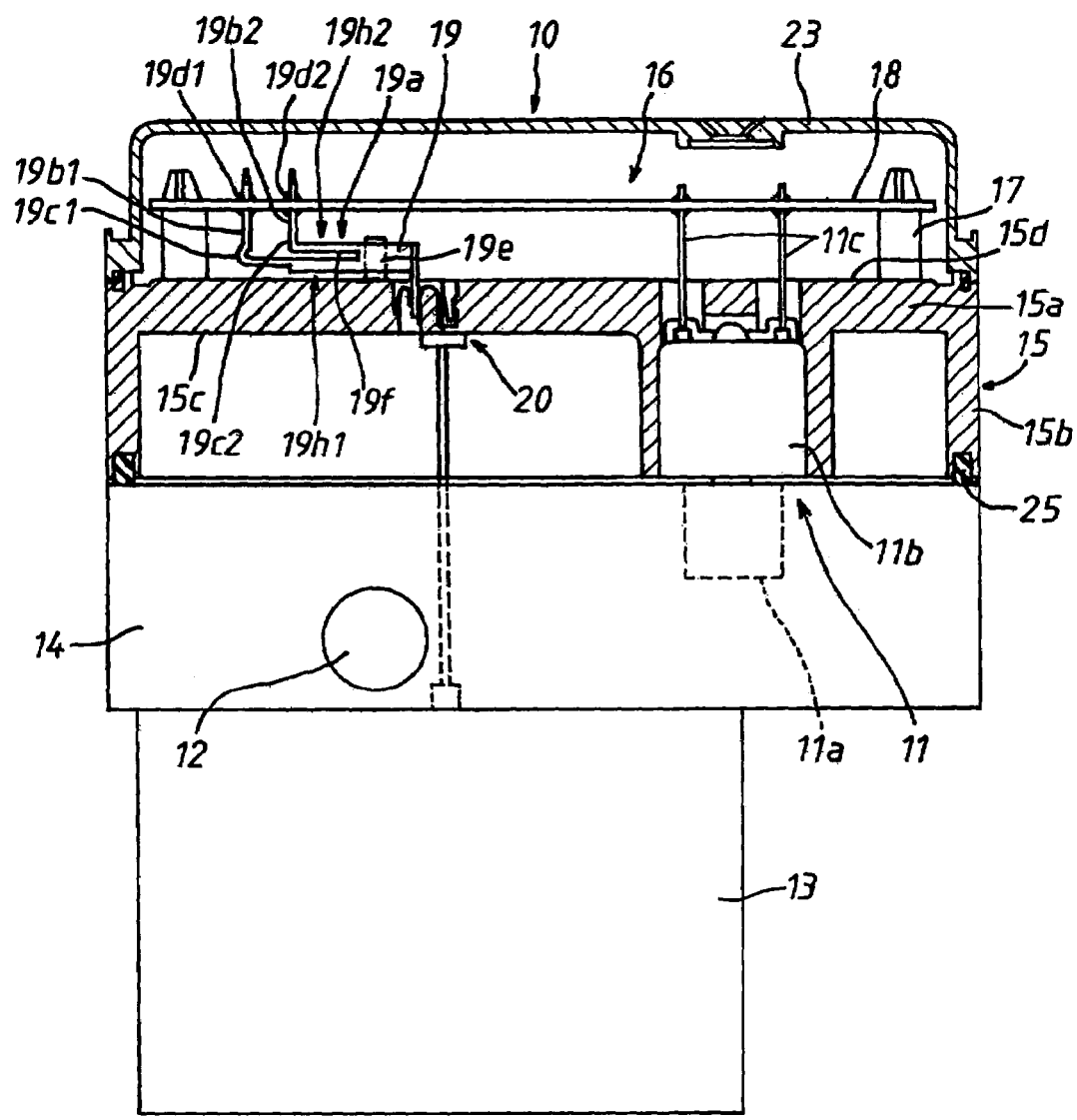
FIG. 1 is an elevation partly in section of a pressure regulating device incorporating an electronic control unit in a first embodiment according to the present invention.

DETAILED DESCRIPTION OF THE PREFERRED EMBODIMENTS (First Embodiment)

Hereafter, an electronic control unit 16 in a first embodiment according to the present invention will be described with reference to FIGS. 1 and 2 taking an example which is applied to a pressure regulating device 10 for controlling the pressure of oil supplied to each of wheel cylinders in an antiskid brake system for a motor vehicle (not shown). The pressure regulating device 10 is composed of a solenoid valve 11 for controlling the pressure of oil to be supplied to the wheel cylinders; a housing 14 incorporating various equipments or devices such as an oil pump 12, an electric motor 13 for driving the oil pump 12, and the like; and an electric control unit 16 including a circuit board 18 which is secured to a case or chassis 15 fixed to the housing 14, and the like. The housing 14 contains a valve portion 11a of the solenoid valve 11, the oil pump 12 and so forth inside thereof and has secured to its reverse surface the electric motor 13 for driving the oil pump 12. Other devices or equipments controllable by the control unit 16 may also be provided on the reverse surface of the housing 14. The chassis 15 is made of a resin and is provided with a plate portion 15a extending in parallel with an upper surface of the housing 14. A side wall 15b encircling a circumferential edge portion of the plate portion 15a is protruded downward. A coil 11b of the solenoid valve 11 is attached to a lower surface 15c of the plate portion 15a encircled by the side wall 15b, and the valve portion 11a is operable by the coil 11b. The chassis 15 is fixed by means of bolts (not shown) to the housing 14 with a lower end surface of the side wall 15a held in contact with or, seated on, the upper surface of the housing 14 so that it covers the upper surface of the housing 14. A numeral 25 denotes a waterproof packing, which is fit in an annular groove engraved in the lower end surface of the side wall 15b and is kept in contact with the upper surface of the housing 14 for water-tightly isolating an interior space surrounded by the side wall 15b. Several support pillars 17 protrude from a board-side attaching surface 15d of the plate portion 15a, and the circuit board 18 of the electronic control unit 16 is secured by snap fitting to upper end portions of the pillars 17 in parallel to the board-side attaching surface 15d with a predetermined distance secured relative to the same.

A numeral 19 denotes a bus bar, which is provided for connecting a power line for, e.g., the electric motor 13 to the circuit board 18. As best shown in FIG. 2, a base portion 19a of the bus bar 19 is provided with plural (e.g., two) branch portions 19c1, 19c2, at which lead portions 19b1, 19b2 are branched. End portions of the lead portions 19b1, 19b2 pierce through perforation holes formed in the circuit board 18 and are joined by soldering to the circuit board 18 thereby to constitute juncture portions 19d1, 19d2. Since the dimensions of the two lead portions 19b1, 19b2 are designed to be smaller, the juncture portions 19d1, 19d2 does not suffer being cracked or broken even when the lead portions 19b1, 19b2 are thermally expanded with an increase in temperature as a result that a large electric current is applied to the electric motor 13 through the bus bar 19.

The bus bar 19 is detachably fixed to the base-side attaching surface 15d with a fixing portion 19e put between a pair of holding pins or projections 15e (one only shown) protruding from the base-side attaching surface 15d and with the branch portions 19c1, 19c2 defined at free ends of the base portion 19a. A notch 19f for separating the branch portions 19c1, 19c2 from each other is formed at the base portion 19a of the bus bar 19. Flexible portions 19g1, 19g2 respectively for the lead portions 19b1, 19b2 are formed between the branch portions 19c1, 19c2 and the base portion 19a to extend substantially in parallel to the board-side attaching surface 15d. The flexible portions 19g1, 19g2 which the notch 19f formed between the branch portions 19c1, 19c2 and the base portion 19a define at the base portion 19a as described above serve as elastic portions for reducing stresses which are developed at the juncture portions 19d1, 19d2 with a change in temperature, respectively.

A connector 20 is embedded in the plate portion 15a, and a male connector terminal formed on the base portion 19a of the bus bar 19 is engaged with a female connecter terminal 20a of the connector 20 opening at the board-side attaching surface 15d. A male connecter terminal connected to a conductor or lead of the electric motor 13 is engaged with another female terminal 20*b* opening at the lower surface 15*c* of the plate portion 15*a*. As shown in FIG. 1, terminals 11*c* of the coil 11*b* pierce through perforation holes of the circuit board 18 by way of through holes formed in the plate portion 15*a* and are secured by soldering to the circuit board 18. A cover 23 for covering the circuit board 18 and the like is secured to the board-side attaching surface 15*d* of the plate portion 15*a*.

In operation, in accordance with an instruction from the electronic control unit 16, electric current is applied to the electric motor 13 through the lead portions 19*b*1, 19*b*2 joined to the circuit board 18, the base portion 19*a* and the connector 20. Thus, the electric motor 13 is operated to make the oil pump 12 discharge pressurized oil therefrom. Electric current is also applied to the coil 11*b* of the solenoid valve 11, so that the valve portion 11*a* is selectively opened or closed to regulate the pressure of oil supplied to the wheel cylinders (not shown). The pressure regulating device 10 is sufficiently large in the temperature range within which it is used, and the chassis 15 and the circuit board 18 are made of resins which are different in kind, while the bus bar 19 is made a metal. Therefore, as he temperature changes, relative displacement occurs between the circuit board 18 and the bus bar 19 in dependence on the differences in thermal expansion among the chassis 15, the circuit board 18, the bus bar 19 and the like. This causes each of the juncture portions 19*d*1, 19*d*2 to have a stress developed at a three-dimensional direction as well as in a rotational direction. In the first embodiment as described above, those portions which extend between the juncture portions 19*d*1, 19*d*2 of the two leads 19*b*1, 19*b*2 to the circuit board 18 and the branch portions 19*c*1, 19*c*2 at which the two leads 19*b*1, 19*b*2 branch from the base portion 19*a* are separated by the elastic portions 19*h*1, 19*h*2 to be flexible independently of each other. Therefore, the stresses which are developed at the juncture portions 19*d*1, 19*d*2 as the temperature changes can be reduced reliably by the elastic portions 19*h*1, 19*h*2 respectively, so that the juncture portions 19*d*1, 19*d*2 made by soldering can be prevented from being broken or damaged.

(Second Embodiment)

An electronic control unit in a second embodiment is different from that in the foregoing first embodiment in the shape of elastic portions formed on a bus bar as well as in the manner of fixing the bus bar onto the board-side attaching surface 15*d*. Therefore, the second embodiment so different from the foregoing first embodiment will be described with reference to FIG. 3 with respect to such differences only. A bus bar 21 is detachably fixed to the board-side attaching surface 15*d* with a fixing portion 21*e* of a base portion 21*a* thereof fixed by means of a bolt 22 to the board-side attaching surface 15*d*. The base portion 21*a* is bent at an end of the fixing portion 21*e* at right angle in a direction going way from the board-side attaching surface 15*d* and is further bent at right angle to space a predetermined distance from the board-side attaching surface 15*d* and to extend in parallel to the same so that a crank portion 21*f* is formed. A flexible portion 21*g*2 which defines a branch portion 21*c*1 as a free end and another flexible portion 21*g*1 which has another branch portion 21*c*2 at a free end side are formed to extend serially from the crank portion 21*f* substantially in parallel to the board-side attaching surface 15*d*. The flexible portions 21*g*2 constitutes a part of the flexible portion 21*g*1 so that the flexible portion 21*g*1 is connected to the crank portion 21*f* through the flexible portion 21*g*2. Two leads portions 21*b*1, 21*b*2 branch from the base portion 21*a* respectively at the branch portions 21*c*1, 21*c*2. End portions of the two lead portions 21*b*1, 21*b*2 pierce through perforation holes formed in the circuit board 18 and are joined by soldering to the circuit board 18 thereby to constitute juncture portions 21*d*1, 21*d*2, respectively. In this manner, the crank portion 21*f* is formed to adjoin to the fixing portion 21*e* of the base portion 21*a* of the bus bar 21, and the flexible portions 21*g*1, 21*g*2 are formed between the crank portion 21*f* and the branch portions 21*c*1, 21*c*2 in correspondence to the lead portions 21*b*1, 21*b*2, respectively. The crank portion 21*f* and the flexible portions 21*g*1, 21*g*2 serve as elastic portions 21*h*1, 21*h*2 respectively for reducing stresses which are developed at the juncture portions 21*d*1, 21*d*2 as the temperature changes.

In operation, as the temperature changes, the circuit board 18 and the bus bar 21 changes there positions relative to each other in dependence on differences in thermal expansion coefficient among the chassis 15, the circuit board 18, the bus bar 21 and the like. At this time, those portions which extend between the juncture portions 21*d*1, 21*d*2 of the two lead portions 21*b*1, 21*b*2 to the circuit board 18 and the branch portions 21*c*1, 21*c*2 are flexed through the elastic portions 21*h*1, 21*h*2 independently of each other. Consequently, the stresses which are developed at the juncture portions 21*d*1, 21*d*2 are reliably reduced at the elastic portions 19*c*1, 19*c*2, so that the juncture portions 21*d*1, 21*d*2 made by soldering can be prevented from being broken or damaged.

(Modifications of the Second Embodiment)

Figure 4:
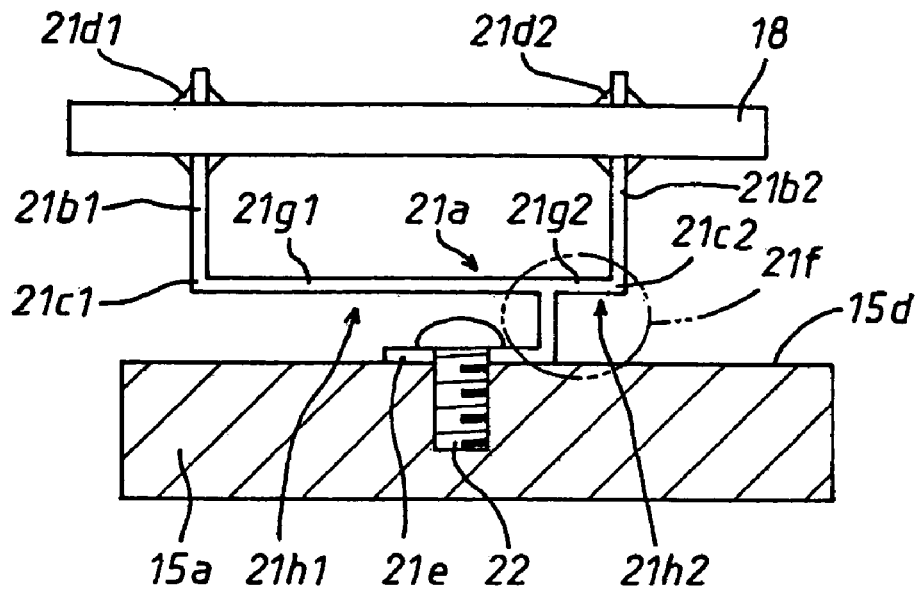
FIG. 4 is another explanatory view showing a modified form of the second embodiment.
Figure 5:
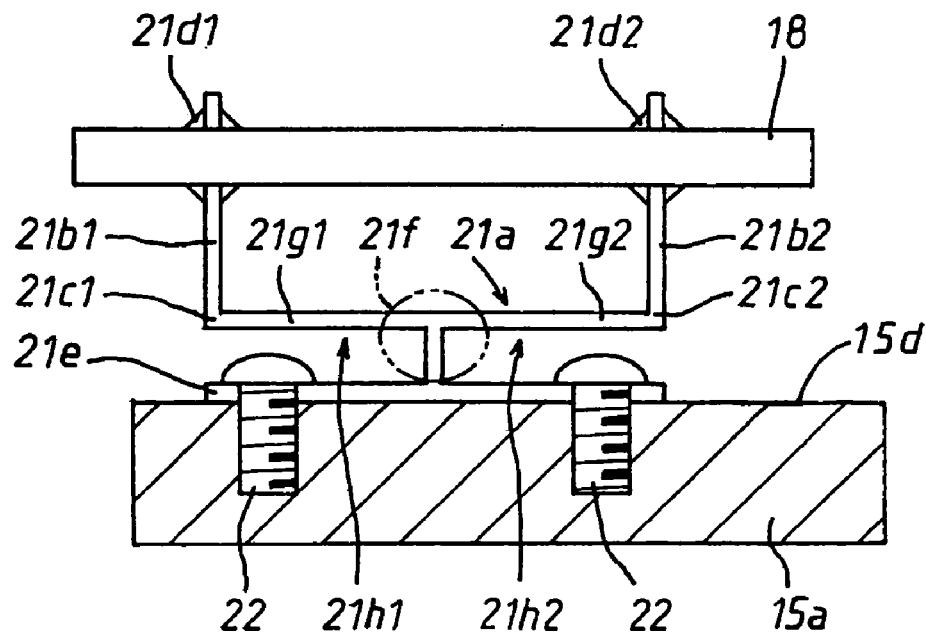
FIG. 5 is still another explanatory view showing a further modified form of the second embodiment.

Next, modifications of the foregoing second embodiment will be described with reference to FIGS. 4 and 5. Although in the second embodiment shown in FIG. 3, the flexible portions 21*h*1, 21*h*2 are arranged at the same side with respect to the crank portion 21*f*, they may be arranged at opposite sides of the crank portion 21*f* as shown in FIG. 4. In this modified form, the flexible portions 21*g*1, 21*g*2 which respectively define the branch portions 21*c*1, 21*c*2 at their free ends are formed on the base portion 21*a* to extend from the crank portion 21*f* in substantially parallel to the board-side attaching surface 15*d*. That is, the two flexible portions 21*g*, 21*g*2 respectively have the branch portions 21*c*1, 21*c*2 at outer ends thereof, and the crank portion 21*f* is connected to inner ends of the two flexible portions 21*g*1, 21*g*2 between the branch portions 21*c*1, 21*c*2.

Further, in the modification shown in FIG. 4, the crank portion 21*f* is provided at a position closer to one of the lead portions 21*b*2 than to the other lead portion 21*b*1 but between the two branch portions 21*c*1, 21*c*2. However, another modification of the second embodiment may be provided as shown in FIG. 5. That is, a fixing portion 21*e* of a base portion 21*a* is detachably fixed by means of bolts 22 at opposite ends thereof to the board-side attaching surface 15*d*. An elastic leg is upright from the center of the fixing portion 21*e*. Two flexible portions 21*g*1, 21*g*2 are protruded from the both sides of an upper end of the elastic leg to extend at right angle thereto so that a crank portion 21*f* is formed. The flexible portions 21*g*1, 21*g*2 are extended to have the same distances to the branch portions 21*c*1, 21*c*2 thereby to constitute the elastic portions 21*h*1, 21*h*2. Thus, the two flexible portions 21*g*1, 21*g*2 respectively have the branch portions 21*c*1, 21*c*2 at outer ends thereof, and the crank portion 21*f* is connected to inner ends of the two flexible portions 21*g*1, 21*g*2 between the branch portions 21*c*1, 21*c*2. The crank portion 21*f* is connected to the inner ends of the two flexible portions 21*g*1, 21*g*2 at a center position between the two branch portions 21*c*, 21*c*2.

In the foregoing embodiments, the bus bar 19, 21 which is connected to a power line for the electric motor 13 is branched into two lead portions 21b1, 21b2 to be joined to the circuit board 18. However, the present invention may be applied to another embodiment wherein for example, a signal line from a sensor is connected to the bus bar and wherein plural lead portions are branched at branch portions of the base portion to be joined to the circuit board.

Figure 2:
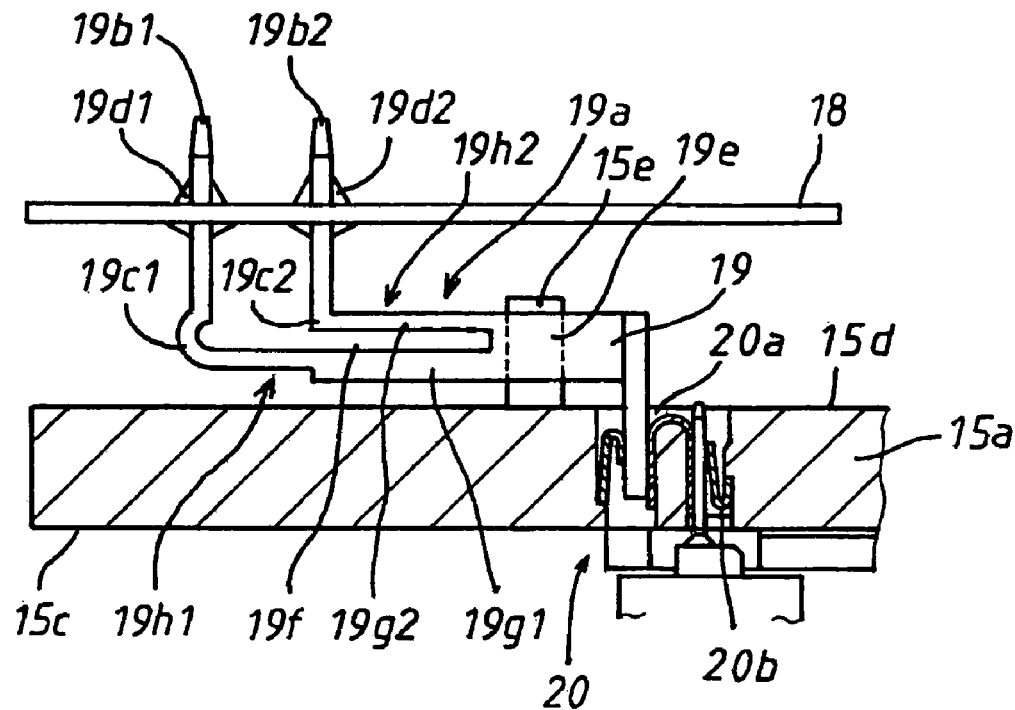
FIG. 2 is an explanatory view showing the way of fixing a bus bar to a board-side attaching surface as well as of joining the bus bar to a circuit board in the first embodiment.

Various features and many of the attendant advantages in the foregoing embodiments will be summarized as follows:

In the foregoing first embodiment shown in FIGS. 1 and 2, the circuit board 18 for the electronic control unit 16 is fixed to the board-side attaching surface 15d of the plate portion 15a of the chassis 15, with a predetermined space secured relative to the plate portion 15a, and the bus bar 19 is fixed at the fixing portion 19e to the board-side attaching surface 15d, with the branch portions 19c1, 19c2 at which plural lead portions 19b1, 19b2 branch from the base portion 19a. Since the branch portions 19c1, 19c2 of the base portion 19a are defined at free ends of the same and since the elastic portions 19h1, 19h2 are formed between the branch portions 19c1, 19c2 and the fixing portion 19e substantially in parallel to the board-side attaching surface 15d, those portions which extend between the juncture portions 19d1, 19d2 of the lead portions 19b1, 19b2 to the circuit board 18 and the branch portions 19c1, 19c2 at which the lead portions 19b1, 19b2 are branched from the base portion 19a are flexibly separated from each other. Thus, stresses which are developed at the juncture portions 19d1, 19d2 of the lead portions 19b1, 19b2 to the circuit board 18 as the temperature changes can be reliably reduced through the elastic portions 19h1, 19h2, whereby the juncture portions 19d1, 19d2 can be prevented from being broken or damaged.

Also in the foregoing first embodiment typically shown in FIG. 2, the notch 19f separating the branch portions 19c1, 19c2 from each other is provided at the base portion 19a of the bus bar 19 which is fixed at its fixing portion 19e to the board-side attaching surface 15d, and the flexible portions 19g1, 19g2 respectively corresponding to the lead portions 19b1, 19b2 are formed between the branch portions 19c1, 19c2 and the fixing portion 19e substantially in parallel to the board-side attaching surface 15d. Therefore, stresses which are developed at the juncture portions 19d1, 19d2 of the lead portions 19b1, 19b2 to the circuit board 18 as the temperature changes can be reliably reduced through the flexible portions 19g1, 19g2 which are arranged in a narrow space between the board-side attaching surface 15d and the circuit board 18, whereby the juncture portions 19d1, 19d2 can be prevented from being broken or damaged.

Figure 3:
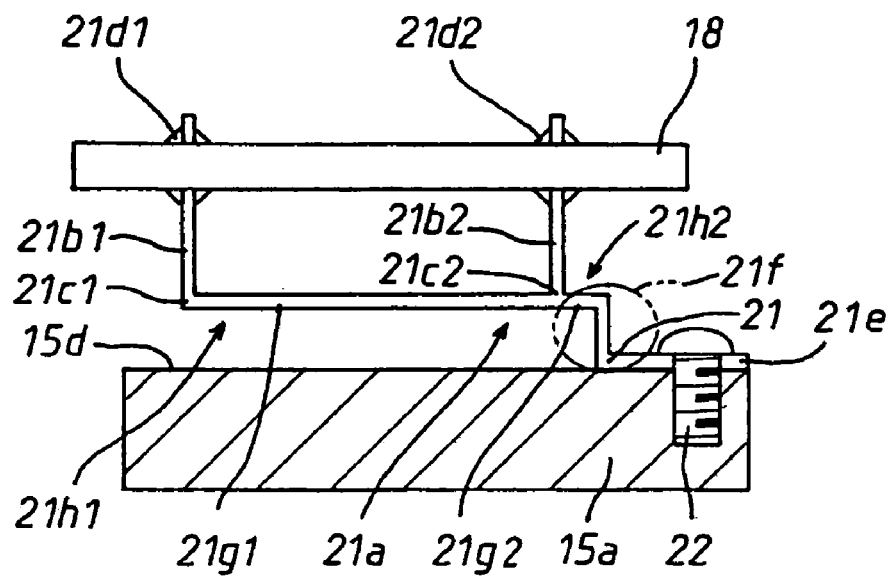
FIG. 3 is another explanatory view showing the way of fixing a bus bar to a board-side attaching surface as well as of joining the bus bar to a circuit board in a second embodiment.

Further, in the foregoing second embodiment shown in FIG. 3, the base portion 21a of the bus bar 21 which is fixed at its fixing portion 21e to the board-side attaching surface 15d is provided with the crank portion 21f at a position close to the fixing portion 21e and is further provided with the flexible portions 21g1, 21g2, corresponding respectively to the lead portions 21b1, 21b2, between the crank portion 21f and the branch portions 21c1, 21c2 substantially in parallel to the board-side attaching surface 15d. Therefore, stresses which are developed at the juncture portions 21d1, 21d2 of the lead portions 21b1, 21b2 to the circuit board 18 as the temperature changes can be reliably reduced through the crank portion 21f and the flexible portions 21g1, 21g2 which are arranged in a narrow space between the board-side attaching surface 15d and the circuit board 18, whereby the juncture portions 21d1, 21d2 can be prevented from being broken or damaged.

Obviously, numerous modifications and variations of the present invention are possible in light of the above teachings. It is therefore to be understood that within the scope of the appended claims, the present invention may be practiced otherwise than as specifically described herein.

What is claimed is:

1. An electronic control unit comprising:
   a chassis having a plate portion and protruding a side wall from the circumference of said plate portion;
   a circuit board secured to a board-side attaching surface of said plate portion opposite to a surface from which said side wall protrudes, said circuit board being held substantially in parallel to said board-side attaching surface with a predetermined space secured therebetween;
   a housing incorporating at least one device and mounting said chassis on a surface thereof with an end surface of said side wall being in contact with said surface of said housing; and
   a bus bar including:
   (a) a base portion having a fixing portion at a part thereof fixed to said plate portion and connected to a lead of said at least one device taken out from said housing, said base portion also having plural branch portions thereon;
   (b) plural lead portions extending respectively from said plural branch portions of said base portion and having end portions thereof joined to said circuit board; and
   (c) plural elastic portions provided between said branch portions and said fixing portion of said base portion for reducing stress which are developed respectively at juncture portions where said end portions of said plural lead portions are joined to said circuit board, respectively.

2. The electronic control unit as set forth in claim 1, wherein:
   said bus bar is fixed at said fixing portion of said base portion thereof to said board-side attaching surface of said plate portion; and
   said base portion is provided with a notch which separates said branch portions from each other so that flexible portions respectively corresponding to said plural lead portions are formed between said plural branch portions and said fixing portion alongside of said board-side attaching surface.

3. An electronic control unit comprising:
   a chassis having a plate portion and protruding a side wall from the circumference of said plate portion;
   a circuit board secured to a board-side attaching surface of said plate portion opposite to a surface from which said side wall protrudes, said circuit board being held substantially in parallel to said board-side attaching surface with a predetermined space secured therebetween;
   a housing incorporating at least one device and mounting said chassis on a surface thereof with an end surface of said side wall being in contact with said surface of said housing; and
   a bus bar including:
   (a) a base portion having a fixing portion at a part thereof fixed to said plate portion and connected to a lead of said at least one device taken out from said housing, said base portion having plural branch portions thereon;
   (b) plural lead portions extending respectively from said plural branch portions of said base portion and having end portions thereof joined to said circuit board;
   (c) a crank portion provided on said base portion at a position close to said fixing portion; and
   (d) plural flexible portions provided between said plural branch portions and said fixing portion respectively in correspondence to said lead portions and extending alongside of said board-side attaching surface.

4. The electronic control unit as set forth in claim 3, wherein:
said plural flexible portions are two flexible portions, and one of said plural flexible portions is connected to said crank portion through the other flexible portion.

5. The electronic control unit as set forth in claim 3, wherein:
said plural flexible portions are two flexible portions respectively having said branch portions at outer ends thereof, and
said crank portion is connected to inner ends of said two flexible portions between said branch portions.

6. The electronic control unit as set forth in claim 5, wherein:
said crank portion is connected to said inner ends of said two flexible portions at a poison close to one of said branch portions but between the same.

7. The electronic control unit as set forth in claim 5, wherein:
said crank portion is connected to said inner ends of said two flexible portions at a center position between said two branch portions.

* * * * *